United States Patent
Tometsuka

(10) Patent No.: US 8,173,214 B2
(45) Date of Patent: *May 8, 2012

(54) SUBSTRATE PROCESSING METHOD

(75) Inventor: Kouji Tometsuka, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 210 days.

This patent is subject to a terminal disclaimer.

(21) Appl. No.: 12/470,084

(22) Filed: May 21, 2009

(65) Prior Publication Data

US 2009/0246962 A1 Oct. 1, 2009

Related U.S. Application Data

(60) Continuation of application No. 11/296,440, filed on Dec. 8, 2005, now Pat. No. 7,553,518, which is a continuation of application No. 10/915,463, filed on Aug. 11, 2004, now Pat. No. 7,003,219, which is a division of application No. 09/911,741, filed on Jul. 25, 2001, now abandoned.

(30) Foreign Application Priority Data

Jul. 25, 2000 (JP) .................................. 2000-223454

(51) Int. Cl.
*C23C 16/00* (2006.01)

(52) U.S. Cl. ..................................... 427/255.5; 134/1.3

(58) Field of Classification Search ............... 427/255.5, 427/251; 134/1.2, 1.3
See application file for complete search history.

(56) References Cited

U.S. PATENT DOCUMENTS

| | | | |
|---|---|---|---|
| 5,112,641 A | 5/1992 | Harada et al. | |
| 5,248,886 A | 9/1993 | Asakawa et al. | |
| 5,294,262 A * | 3/1994 | Nishimura | 134/22.1 |
| 5,314,509 A * | 5/1994 | Kato et al. | 34/406 |
| 5,683,513 A | 11/1997 | Fujimaki | |
| 5,858,103 A | 1/1999 | Nakajima et al. | |
| 5,882,413 A * | 3/1999 | Beaulieu et al. | 118/719 |
| 6,238,488 B1 | 5/2001 | Fujita et al. | |
| 6,301,802 B1 | 10/2001 | Kato et al. | |
| 7,003,219 B2 | 2/2006 | Tometsuka | |

FOREIGN PATENT DOCUMENTS

| | | |
|---|---|---|
| JP | 05283306 A | 10/1993 |
| JP | 11269644 A * | 10/1999 |

* cited by examiner

*Primary Examiner* — Roberts Culbert
(74) *Attorney, Agent, or Firm* — Bacon & Thomas, PLLC

(57) ABSTRACT

A substrate processing method for use in a substrate processing apparatus having a stocker therein which stores a multiplicity of dummy substrates; a reaction chamber for producing semiconductor products; and a transferring unit for transferring into the reaction chamber a process substrate and the dummy substrate stored in the stocker in order to form a film on the process substrate, the method includes transferring one dummy substrate selected among the dummy substrates stored in the stocker to the reaction chamber without being out of the apparatus; and introducing a cleaning gas into the reaction chamber to clean said one dummy substrate within the reaction chamber.

2 Claims, 4 Drawing Sheets

SUBSTRATE PROCESSING METHOD

CROSS-REFERENCE TO RELATED APPLICATIONS

This application is a continuation application of parent U.S. Ser. No. 11/296,440, filed Dec. 8, 2005, which is a continuation application of U.S. Ser. No. 10/915,463, filed Aug. 11, 2004, now U.S. Pat. No. 7,003,219, which is a divisional application of U.S. Ser. No. 09/911,741, filed Jul. 25, 2001, now abandoned. The benefit of the earlier filing date is herein claimed under 35 U.S.C. 121 and the entire disclosure of the pending, prior application is hereby incorporated by reference.

FIELD OF THE INVENTION

The present invention relates to a semiconductor manufacturing apparatus; and, more particularly, to a semiconductor manufacturing apparatus for forming a semiconductor film on a wafer.

BACKGROUND OF THE INVENTION

In a manufacturing process of semiconductor devices such as an integrated circuit (IC), a large-scale integration (LSI) circuit and the like, there has been used a semiconductor manufacturing apparatus for forming a semiconductor film on a wafer.

Referring to FIG. 2, there is illustrated a schematic diagram of a conventional semiconductor manufacturing apparatus.

The semiconductor manufacturing apparatus includes a heater 1, a reaction chamber 2 being heated by the heater 1 to a temperature appropriate for performing a semiconductor film forming process, a quartz boat 3 being taken into the reaction chamber 2 along the arrow direction with wafers loaded thereon, a wafer carrier 4 for transferring silicon wafers 14 between a wafer cassette 7 and the quartz boat 3, the wafer cassette 7 acting as a carrier bringing wafers into or out of the apparatus, a process gas line 9 through which a process gas for inducing the semiconductor film forming reaction is supplied to the apparatus, and a vacuum exhaust 10 for evacuating the reaction chamber 2 to vacuum or maintaining the inner pressure of the reaction chamber 2 at a certain level.

Referring to FIG. 3, there is schematically shown the reaction chamber 2 into which the quartz boat 3 is loaded during a semiconductor film forming process. A plurality of silicon wafers 14, only some of the wafers being depicted for illustration purpose, loaded on the quartz boat 3 are arranged in the reaction chamber 2 while maintaining a constant interval therebetween.

The process gas line 9 provides the reaction chamber 2 with the process gas, which induces the semiconductor film forming reaction while it passes through an internal tube 13 to thereby form semiconductor films on the silicon wafers 14. After the reaction process is completed, the used process gas is removed by the vacuum exhaust 10 through a space between an external tube 12 and the internal tube 13. In FIG. 3, one or more adiabatic plates 15 serve to reduce or prevent heat loss from the reaction chamber 2.

FIG. 4 describes a wafer arrangement during the semiconductor film forming process. In such a batch-type semiconductor film forming apparatus, the semiconductor film forming process should be carried out under a constant reaction condition so as to reproducibly obtain the thickness uniformity of the semiconductor films formed on silicon wafers. For this purpose, the wafers are arranged as illustrated in FIG. 4.

First of all, since the reaction condition near both ends of the wafer arrangement is not stabilized, dummy wafers are arranged in regions near the ends (indicated as an upper and a lower dummy wafer regions in FIG. 4), wherein a dummy wafer represents a wafer not being used for producing final products. In the remaining region of the wafer arrangement (designated as a process region in FIG. 4), the semiconductor films are formed under a controlled reaction condition on silicon wafers to be used for producing semiconductor products.

In case there are empty spaces between the silicon wafers positioned in the process region, the non-uniformity of the reaction condition which might be caused due to irregular intervals between the silicon wafers may be prevented by supplementing the empty spaces with dummy wafers as shown in FIG. 4.

As described above, the conventional batch-type semiconductor film forming apparatus achieves the uniformity of the reaction condition by using the dummy wafers. However, the use of dummy wafers leads to a waste, thereby increasing, especially, in a case of small batch production where various products in small quantities are produced, the semiconductor manufacturing cost.

The dummy wafers are loaded in a wafer cassette first and then transferred into the apparatus. Thereafter, a required number of dummy wafers are loaded on the quartz boat after being retrieved from the wafer cassette.

After being used for a predetermined number of times, the dummy wafers are taken out from the semiconductor manufacturing apparatus and then subject to a cleaning process thereof. The time required for the dummy wafer unloading process and the cleaning process also gives rise to an increase in the semiconductor manufacturing time.

SUMMARY OF THE INVENTION

It is, therefore, a primary object of the present invention to provide a semiconductor manufacturing apparatus or substrate processing apparatus capable of reducing the semiconductor manufacturing cost by solving the cost increasing problem resulting from the consumption of dummy wafers and the semiconductor manufacturing time increasing problem caused by the external cleaning of the dummy wafers.

In accordance with the present invention, there is provided a substrate processing apparatus, comprising:

a reaction chamber for simultaneously processing a plurality of process substrates;

a boat for loading the process substrates into the reaction chamber; and a stocker for storing a multiple number of dummy substrates, at least a portion of the dummy substrates being loaded into the reaction chamber together with the process substrates through the use of the boat, wherein a substrate cleaning process is carried out by loading the dummy substrates to be cleaned into the reaction chamber through the use of the boat and introducing a cleaning gas into the reaction chamber.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
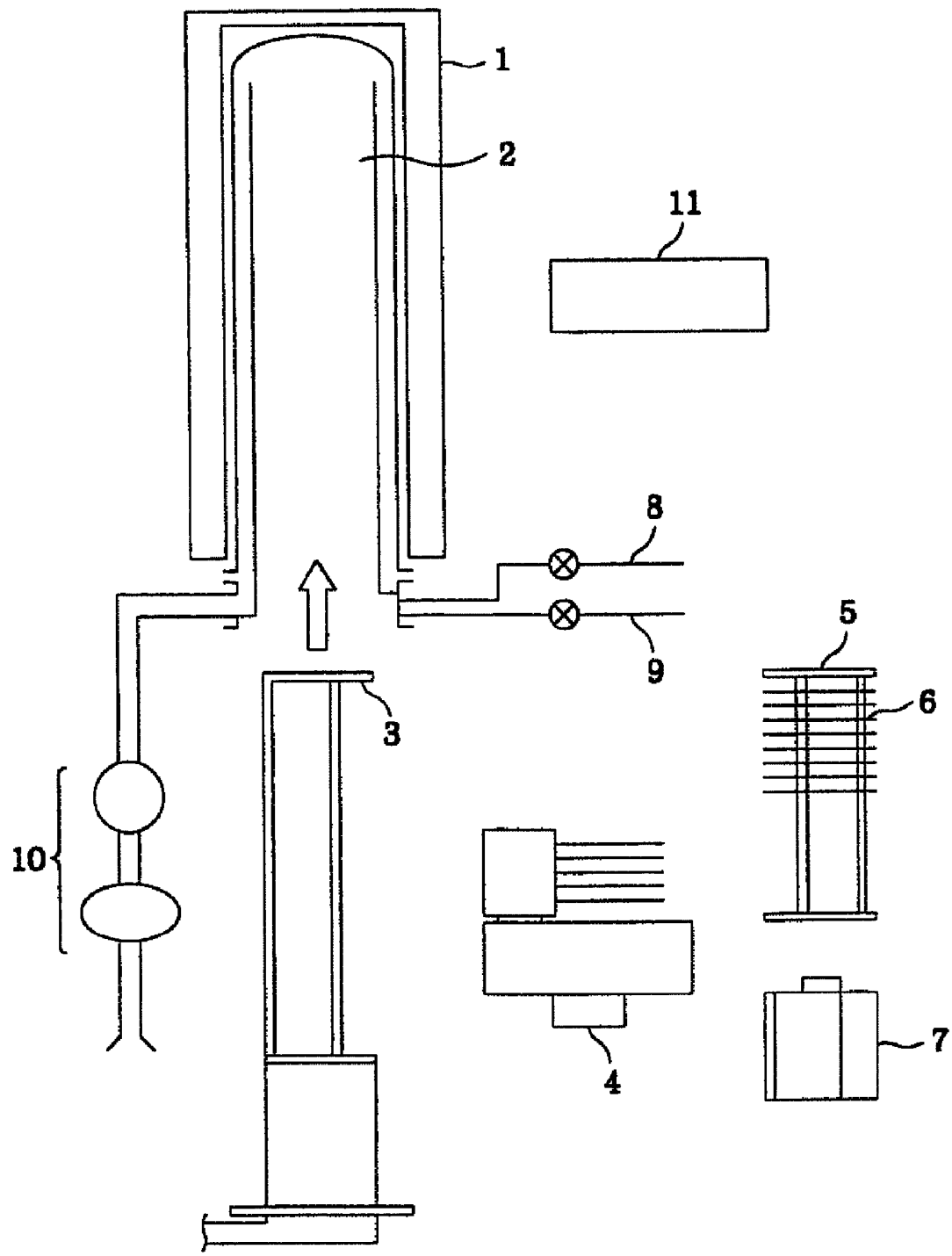
FIG. 1 illustrates a schematic diagram of a semiconductor manufacturing apparatus in accordance with the present invention.
Figure 2:
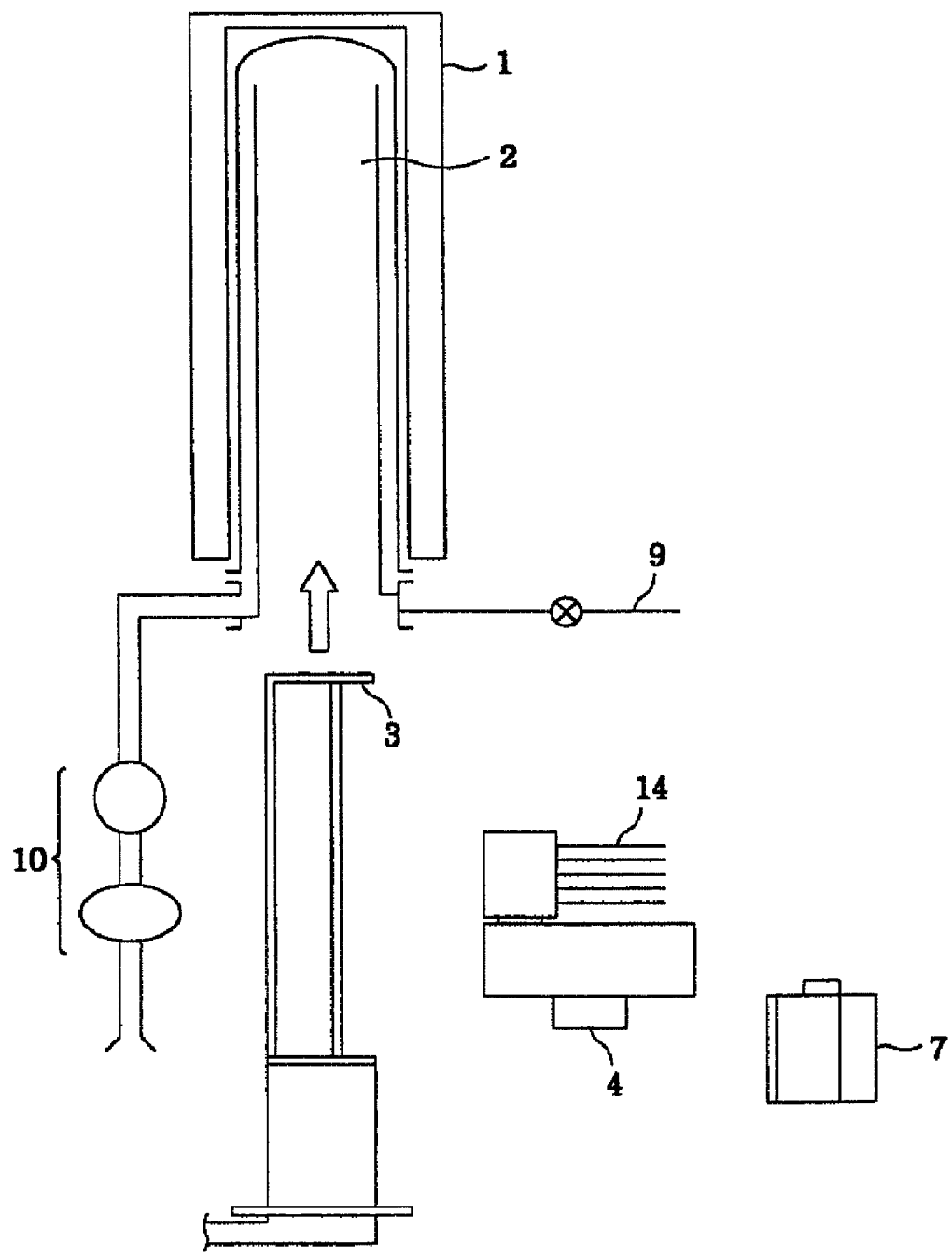
FIG. 2 exemplarily shows a schematic diagram of a conventional semiconductor manufacturing apparatus.
Figure 3:
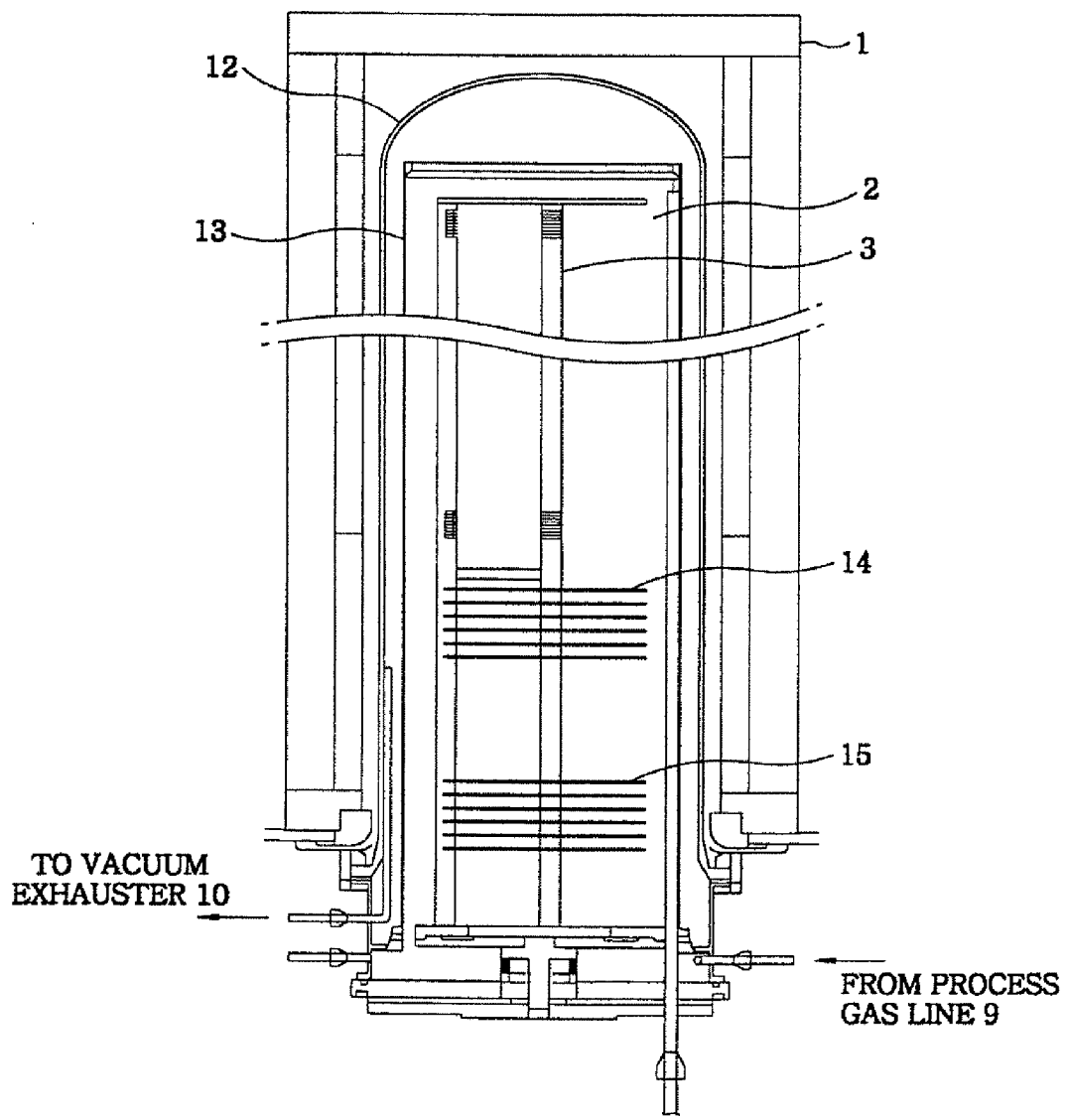
FIG. 3 depicts a reaction chamber into which wafers are loaded for a semiconductor film forming process.

Referring to FIG. 1, there is illustrated a schematic diagram of a semiconductor manufacturing apparatus (substrate processing apparatus) in accordance with a preferred embodiment of the present invention.

The semiconductor manufacturing apparatus includes a heater 1, a reaction chamber 2 being heated by the heater 1 up to a temperature appropriate for performing a semiconductor film forming process, and a quartz boat 3 being brought into the reaction chamber 2 along the arrow direction with process substrates, e.g., silicon wafers, and dummy substrates, e.g., quartz dummy wafers, loaded thereon. The semiconductor manufacturing apparatus is also provided with a wafer carrier 4 for transferring the silicon wafers between the quartz boat 3 and a wafer cassette 7 acting as a carrier bringing wafers into or out of the apparatus and a quartz wafer stocker 5 for storing quartz dummy wafers 6 in the apparatus. The wafer carrier 4 is also used in transferring the dummy wafers between the quartz boat 3 and the quartz wafer stocker 5. Also provided in the semiconductor manufacturing apparatus are a cleaning gas line 8 for providing the apparatus with a cleaning gas to be used in a cleaning process for removing dirt existing in the reaction chamber 2, a process gas line 9 for supplying the apparatus with a process gas for inducing the semiconductor film forming reaction, and a vacuum exhaust 10 for evacuating the reaction chamber 2 to vacuum or maintaining the inner pressure of the reaction chamber 2 at a desired level. The reference numeral 11 represents a batch counter for counting the number of semiconductor film forming processes carried out.

Figure 4:
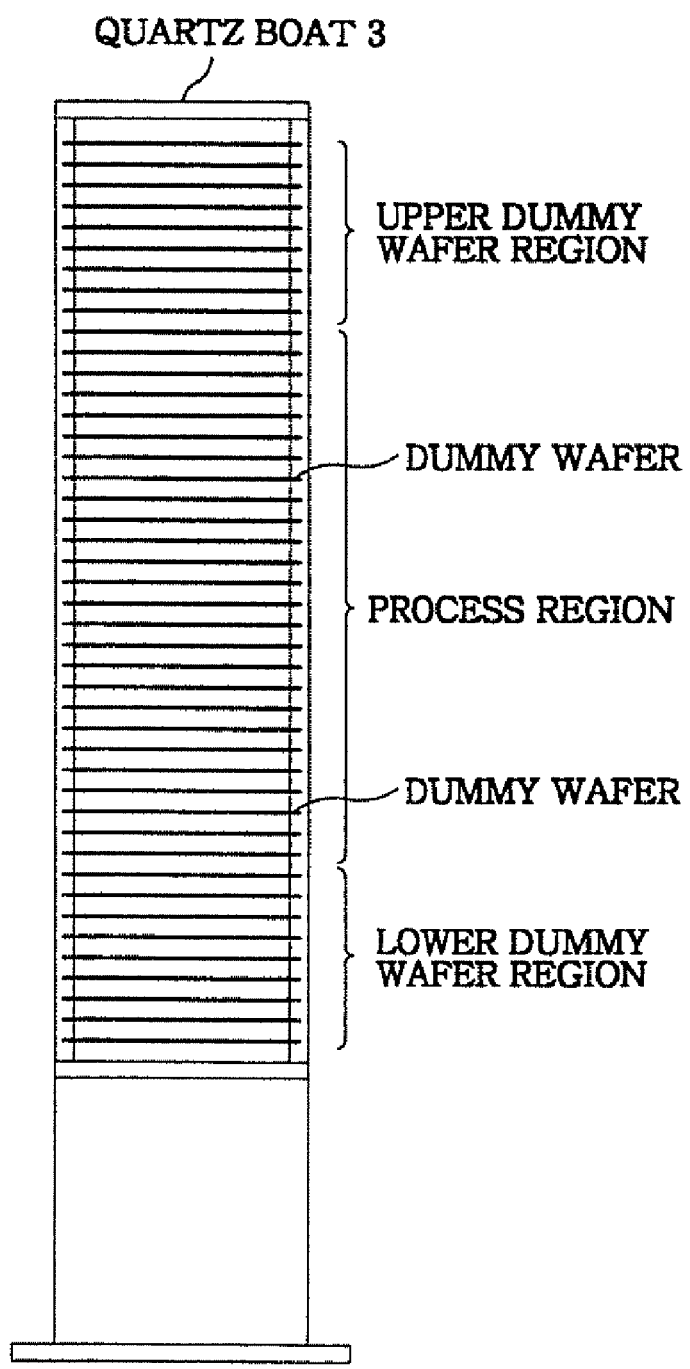
FIG. 4 represents a wafer arrangement during the semiconductor film forming process.

For the semiconductor film forming process for producing semiconductor films on silicon wafers, wafers are loaded on the quartz boat 3 in an arrangement as shown in FIG. 4. In accordance with the preferred embodiment of the present invention, however, the quartz wafers 6 are used as the dummy wafers. The quartz wafers 6 are loaded into the upper and the lower dummy wafer region of the quartz boat 3 and also into empty slots in the process region where silicon wafers are absent, thereby fully filling the quartz boat 3 with wafers. The quartz boat 3 filled with the wafers is loaded into the reaction chamber 2 along the arrow direction as shown in FIG. 1.

Then, in accordance with a predetermined process condition, the inventive apparatus reduces the inner pressure of the reaction chamber 2 by using the vacuum exhaust 10 and supplies the reaction chamber 2 with the process gas through the process gas line 9 to thereby uniformly produce semiconductor films on the silicon wafers.

After the semiconductor film forming process is completed, the quartz wafers 6 are transferred to the quartz wafer stocker 5 by the wafer carrier 4 and reused in subsequent semiconductor film forming processes without being taken out of the apparatus.

The quartz dummy wafers 6 have an experimentally determined maximum number of usages (or a limit of film thickness accumulated thereon) beyond which there occurs particulate generation, so that the product yield of the semiconductor manufacturing process is deteriorated. In a preferred embodiment of the invention, the number of usages is used as a measure to determine a cleaning timing of quartz dummy wafers. Therefore, the number of usages of the quartz wafers 6 is monitored by the batch counter 11. If the number of usages reaches the limit, such quartz wafers are stocked in the quartz wafer stocker 5 and are not used again before being cleaned. Other cleaned quartz wafers stored in the quartz wafer stocker 5 are used as the dummy wafers in a next semiconductor film forming process.

Such selection of the dummy wafers can be accomplished by an apparatus operator in response to an alert from the batch counter 11 or an auxiliary device thereof when the number of usages reaches the limit, or can be automatically performed in response to an output of the batch counter 11.

In case a total film thickness accumulated on the dummy wafers is preferably used as the measure to determine the cleaning timing of the dummy wafers, the total film thickness has to be monitored for each dummy wafer. Such monitoring of the film thickness can be accomplished in various ways apparent to those skilled in the art and, therefore, will not be described in detail.

As shown above, the inventive apparatus employs therein a device for storing the dummy wafers, e.g., the quartz wafer stocker 5. Therefore, by enlarging the capacity of the quartz wafer stocker 5, i.e., the number of wafers which can be stocked therein, it becomes possible, even in a case of cleaning the dummy wafers outside the apparatus, to considerably reduce the frequency of loading and unloading dummy wafers into or out of the apparatus, when compared with the conventional apparatus. As a result, the operation of the apparatus becomes simplified, which in turn reduces the semiconductor manufacturing cost.

It is preferable that the capacity of the quartz wafer stocker 5 is a multiple of the number of dummy wafers being used per one batch process. In the preferred embodiment of the present invention, about 70% of the whole wafers loaded on the quartz boat 3 are silicon process wafers and about 30% thereof are quartz dummy wafers. Therefore, if the total capacity of the quartz boat 3 is 100 wafers, it is preferable that the capacity of the quartz wafer stocker 5 becomes a 30×n wafers, n being a positive integer including 1.

Meanwhile, since the inventive apparatus uses the quartz wafers 6 as the dummy wafers, the wafer cleaning can be performed in the apparatus, so that there is no need to bring the dummy wafers into and out of the apparatus. This will be described hereinafter.

Since the required frequency of cleaning the reaction chamber 2 and the quartz boat 3 is less than that of the quartz dummy wafers 6, the inside of the reaction chamber 2 is cleaned when all of the quartz dummy wafers 6 stored in the quartz wafer stocker 5 are used up to the limit or at a cleaning time of the reaction chamber 2 and/or the quartz boat 3. In a cleaning process, all the quartz dummy wafers 6 which has been used as many times as the usage limit are transferred into the reaction chamber 2 as being loaded on the quartz boat 3 by the wafer carrier 4. Then, a cleaning gas, e.g., $ClF_3$, is supplied into the reaction chamber 2 through the cleaning gas line B, thereby simultaneously cleaning a quartz reaction tube including, e.g., the inner and the outer tubes 13 and 12, the quartz boat 3 and the quartz dummy wafers 6 under a preset cleaning condition. After the cleaning process is finished, the cleaned quartz dummy wafers 6 are reloaded in the quartz wafer stocker 5 by the wafer carrier 4 and stored as cleaned reusable quartz dummy wafers.

As noted above, in accordance with the preferred embodiment of the present invention, there is no need to bring the cassette for the dummy wafers out of and into the apparatus prior to and after the cleaning process of the dummy wafers. Thus it becomes possible to solve a problem of increasing a processing time required in taking the dummy wafers out of and into the apparatus for the purpose of cleaning them, by avoiding to take the cassette for the silicon process wafers in and out of the apparatus.

Moreover, in accordance with the present invention, a batch counter, e.g., the reference numeral 11 in FIG. 1, counts the number of times dummy wafers, e.g., the quartz wafers 6 in FIG. 1, are used and, if the counted number reaches a predetermined use limit, the batch counter or its auxiliary device generates an alert to an apparatus operator so as to prevent the semiconductor product yield from being deteriorated by overused dummy wafers.

Since the cleaning of the dummy wafers is carried out together with that of other parts, e.g., the reaction chamber 2 and the quartz boat 3, it is possible to shorten a maintenance time of the apparatus. Namely, since the present invention employs a function of removing by using the cleaning gas, e.g., $ClF_3$, semiconductor films deposited on quartz jigs such as a reaction tube and a boat during the semiconductor film forming processes, the maintenance time can be reduced by loading all the used-up dummy wafers, e.g., the quartz wafers 6 in FIG. 1, on the boat, e.g., the reference numeral 3 in FIG. 1, inserting the boat into the reaction chamber, e.g., the reference numeral 2 in FIG. 1, and cleaning the dummy wafers together with the quartz jigs simultaneously.

In addition, by using the quartz wafer capable of enduring repeated cleaning processes and being used semipermanently, it is possible to curtail a semiconductor manufacturing cost due to the consumption of the dummy wafers.

It is to be understood that any other types of wafers than the preferred embodiment quartz dummy wafers can also be used as the dummy wafers as long as they are durable against the temperature of the semiconductor film forming process and the repeated cleaning processes. For instance, a silicon wafer having alumina ($Al_2O_3$) films deposited on both sides thereof by chemical vapor deposition (CVD) can also be used as a dummy wafer in the inventive semiconductor manufacturing apparatus.

Although the present invention has been described with respect to a semiconductor manufacturing apparatus for forming a semiconductor film on a wafer, it should be apparent to those skilled in the art that the invention can equally be applied to other types of semiconductor manufacturing apparatus, e.g., carrying out non-semiconductor film forming process, diffusion processes or the like on silicon wafers. The present invention can also be applied to an apparatus for processing non-silicon wafers or non-semiconductor substrates to produce non-semiconductor films.

While the present invention has been described with respect to the particular embodiments, it will be apparent to those skilled in the art that various changes and modifications may be made without departing from the spirit and scope of the invention as defined in the following claims.

What is claimed is:

1. A substrate processing method for use in a substrate processing apparatus having a stocker therein which stores a multiplicity of dummy substrates; and a reaction chamber for producing semiconductor products, the method comprising:
    transferring into the reaction chamber a process substrate and a dummy substrate selected among the dummy substrates stored in the stocker, the stocker being placed within the apparatus;
    forming a film on the process substrate and the dummy substrate;
    unloading the dummy substrate and the process substrate from the reaction chamber and loading the unloaded dummy substrate into the stocker;
    transferring the loaded dummy substrate from the stocker to the reaction chamber; and
    introducing a cleaning gas into the reaction chamber to simultaneously clean the reaction chamber and the dummy substrate within the reaction chamber.

2. The method as recited in claim 1, further comprising counting the number of usages in processing of each dummy substrate stored in the stocker so as that the number of usages of the dummy substrate is not greater than a predetermined number.

* * * * *